(12) United States Patent
Kim et al.

(10) Patent No.: US 11,302,563 B2
(45) Date of Patent: Apr. 12, 2022

(54) CARRIER FOR BACK END OF LINE PROCESSING

(71) Applicant: Corning Incorporated, Corning, NY (US)

(72) Inventors: Hoon Kim, Horseheads, NY (US); Jin Su Kim, Painted Post, NY (US); Varun Singh, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/905,477

(22) Filed: Jun. 18, 2020

(65) Prior Publication Data

US 2020/0402833 A1 Dec. 24, 2020

Related U.S. Application Data

(60) Provisional application No. 62/864,139, filed on Jun. 20, 2019.

(51) Int. Cl.
| | |
|---|---|
| *H01L 21/683* | (2006.01) |
| *C03C 15/00* | (2006.01) |
| *H01L 21/78* | (2006.01) |
| *H01L 21/304* | (2006.01) |

(52) U.S. Cl.
CPC .......... *H01L 21/6835* (2013.01); *C03C 15/00* (2013.01); *H01L 21/304* (2013.01); *H01L 21/78* (2013.01); *H01L 2221/68327* (2013.01)

(58) Field of Classification Search
CPC ... H01L 21/6835; H01L 21/78; H01L 21/304; H01L 2221/68327; H01L 2221/68313; H01L 25/50; H01L 25/162; H01L 24/29; H01L 24/83; H01L 2224/29019; H01L 2224/83009; C03C 15/00
USPC ........................................................ 438/464
See application file for complete search history.

(56) References Cited

U.S. PATENT DOCUMENTS

| | | | |
|---|---|---|---|
| 4,214,886 A | 7/1980 | Shay et al. | |
| 6,344,105 B1* | 2/2002 | Daugherty | ........ H01L 21/68721 156/345.51 |
| 9,006,081 B2 | 4/2015 | Ahn et al. | |
| 2008/0142946 A1 | 6/2008 | Yang et al. | |
| 2009/0221150 A1* | 9/2009 | Hammond, IV | ........................... H01L 21/68735 438/710 |
| 2009/0280602 A1 | 11/2009 | Bonifield et al. | |
| 2013/0122689 A1 | 5/2013 | Wang et al. | |
| 2017/0174564 A1 | 6/2017 | Cleary et al. | |

* cited by examiner

*Primary Examiner* — Vu A Vu

(57) ABSTRACT

A carrier assembly is configured to support a wafer, including during back end of line (BEOL) processing. The carrier assembly includes dual carriers. A first carrier includes a stepped structure so as to situate the wafer. A side of the wafer is bonded to the first carrier without adhesive. The first carrier is positioned atop the second carrier, so as to be mechanically supported by the second carrier. Each carrier is made by wet etching of laminated glass, without mechanical polishing.

20 Claims, 5 Drawing Sheets

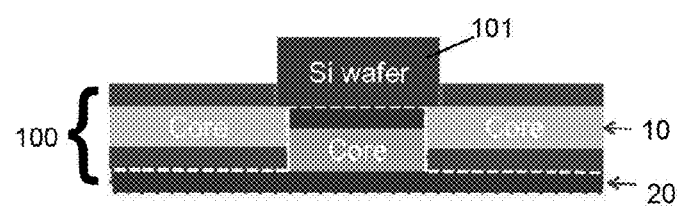
Fig. 1
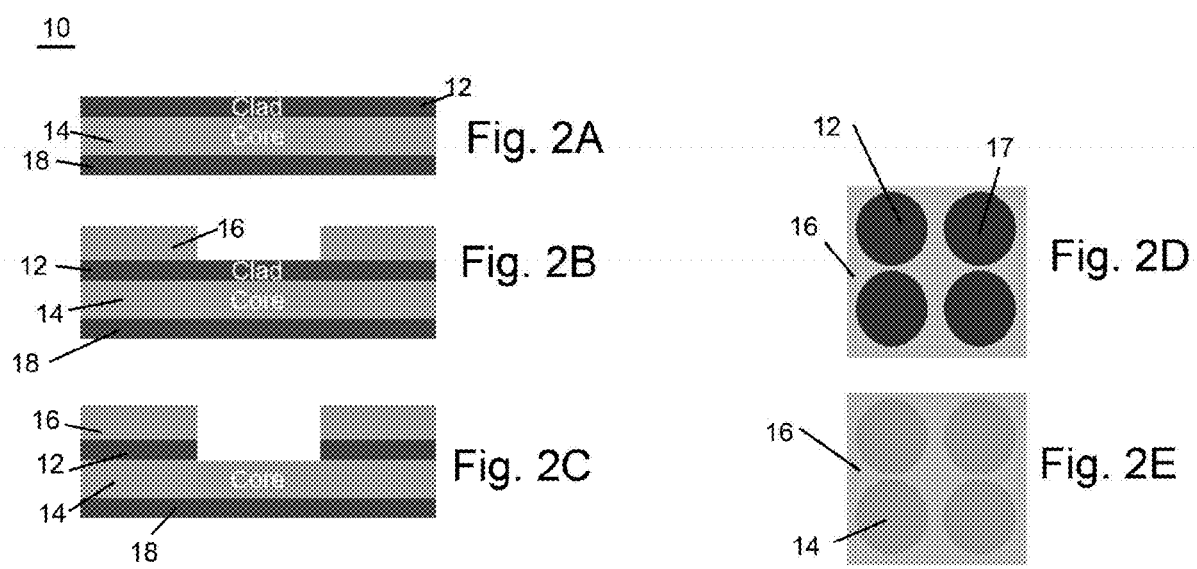

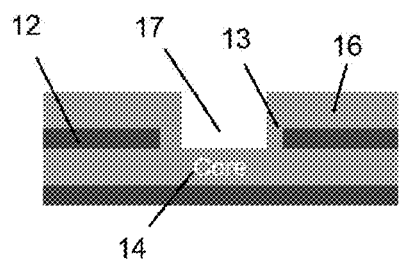
Fig. 3A
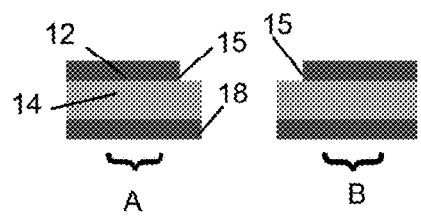
Fig. 3B
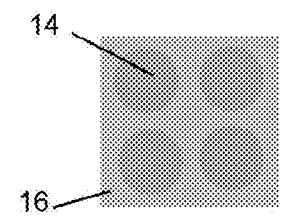
Fig. 3C
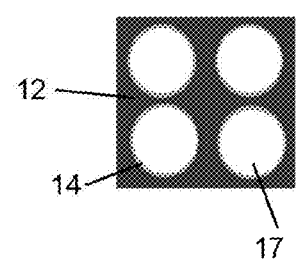
Fig. 3D
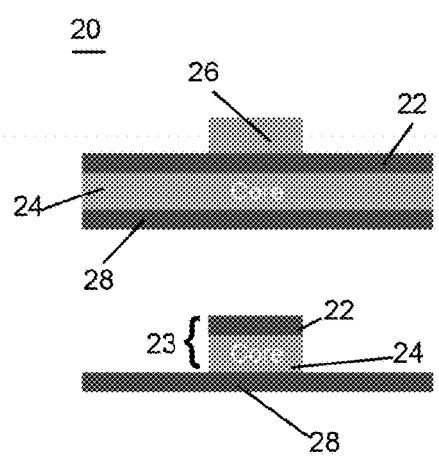
Fig. 4A
Fig. 4B
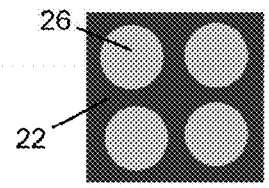
Fig. 4C
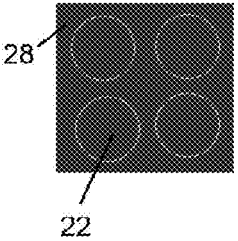
Fig. 4D

CARRIER FOR BACK END OF LINE PROCESSING

This application claims the benefit of priority under 35 U.S.C. § 119 of U.S. Provisional Application Ser. No. 62/864,139, filed on Jun. 20, 2019, the content of which is relied upon and incorporated herein by reference in its entirety.

FIELD

The present application relates generally to integrated circuit fabrication. More particularly, the present application relates to interconnection of electronic devices.

BACKGROUND

Back-end-of-the-line ("BEOL") processing is the second major step of integrated circuit (IC) fabrication, after IC components in the form of individual devices, such as transistors, capacitors, and resistors, have been fabricated. BEOL processing is performed to deposit metal wiring between individual devices in order to interconnect the devices by metallization. BEOL includes a number of steps, including separation of a wafer from a support structure, a process known as debonding.

SUMMARY

The present disclosure relates to techniques to facilitate BEOL processing while protecting wafers from damage. In particular, as described in more detail below with reference to the following exemplary non-limiting embodiments, the present disclosure sets forth devices and methods to facilitate transferring wafers to a stage for dicing so as to increase the wafer yield, i.e., the proportion of wafers that do not have to be discarded due to manufacturing defects.

At least one embodiment of the disclosure relates to a carrier assembly for supporting a wafer, including during BEOL processing. The carrier assembly includes dual carriers. A first carrier includes a stepped structure so as to situate the wafer. A side of the wafer is bonded to the first carrier without adhesive. The first carrier is positioned atop the second carrier, so as to be mechanically supported by the second carrier. Each carrier is made by wet etching of laminated glass, without mechanical polishing.

At least one embodiment of the disclosure relates to a method for supporting a wafer during processing. The method includes positioning a wafer in a first carrier, and supporting the first carrier by a second carrier disposed at least in part beneath the first carrier. The first and second carrier provide a dual carrier in which the wafer is situated. The method further includes transferring the wafer in situ to a dicing stage for dicing of the wafer while in the dual carrier.

Additionally, at least one embodiment of the disclosure relates to a method of making a carrier assembly. The method includes constructing a first carrier of the carrier assembly by attaching a first cladding layer of the first carrier to a first core layer; and attaching a second cladding layer of the first carrier to the first core layer, such that the first core layer is sandwiched between the first cladding layer and the second cladding layer of the first carrier. The method further includes performing a first etching process on the first carrier to expose a portion of the first core layer, and performing a second etching process on the first carrier to form a through hole. Formation of the through hole divides the first carrier into a first segment and a second segment.

These and other features, together with the organization and manner of operation thereof, will become apparent from the following detailed description when taken in conjunction with the accompanying drawings, wherein like elements have like numerals throughout the several drawings described below. It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF THE DRAWINGS

The foregoing and other features of the present disclosure will become more fully apparent from the following description and appended claims taken in conjunction with the accompanying drawings. Understanding that these drawings depict only several implementations in accordance with the disclosure and are therefore not to be considered limiting of its scope, the disclosure will be described with additional specificity and detail through use of the accompanying drawings.

FIG. 1 is a cross-sectional view of a dual carrier in which a wafer is positioned, according to at least one embodiment.

FIG. 2A is a cross-sectional view of a first carrier of a dual carrier prior to patterning, according to at least one embodiment.

FIG. 2B is a cross-sectional view of a first carrier of a dual carrier after patterning, according to at least one embodiment.

FIG. 2C is a cross-sectional view of a first carrier of a dual carrier after etching, according to at least one embodiment.

FIG. 2D is a top view of the first carrier shown in FIG. 2B, according to at least one embodiment.

FIG. 2E is a top view of the first carrier shown in FIG. 2C, according to at least one embodiment.

FIG. 3A is a cross-sectional view depicting a first carrier after patterning to form a through hole, according to at least one embodiment.

FIG. 3B is a cross-sectional view depicting a first carrier after etching and through hole formation, according to at least one embodiment.

FIG. 3C is a top view of the first carrier shown in FIG. 3A, according to at least one embodiment.

FIG. 3D is a top view of the first carrier shown in FIG. 3B, according to at least one embodiment.

FIG. 4A is a cross-sectional view of a second carrier of a dual carrier after patterning, according to at least one embodiment.

FIG. 4B is a cross-sectional view of the second carrier after etching to form a stage, according to at least one embodiment.

FIG. 4C is a top view of the second carrier shown in FIG. 4A, according to at least one embodiment.

FIG. 4D is a top view of the second carrier shown in FIG. 4B, according to at least one embodiment.

Figure 5A:
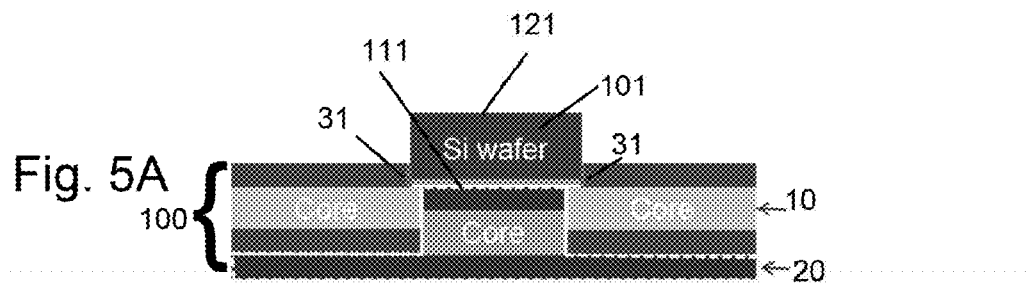
FIG. 5A is a cross-sectional view of a dual carrier to which a wafer is attached, according to at least one embodiment.

Reference is made to the accompanying drawings throughout the following detailed description. In the drawings, similar symbols typically identify similar components unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein and illustrated in the figures, can be arranged, substituted, combined, and designed in a wide variety of different configurations, all of which are explicitly contemplated and made part of this disclosure.

DETAILED DESCRIPTION

Various example embodiments provide for a dual carrier so as to support a wafer, such as a silicon (Si) wafer, during BEOL processing. More particularly, the dual carrier is formed of two carrier pieces, a first carrier positioned atop a second carrier, as discussed below. At least a portion of the dual carrier supports a wafer during multiple stages of BEOL processing. Moreover, at least a portion of the dual carrier supports the wafer during dicing and the individual dies after dicing, such that no separate debonding process is needed.

In at least one embodiment, the dual carrier 100 is a glass article. In at least one embodiment, the glass article may be a glass article as described in U.S. Patent Application Publication No. 2017/0174564 published Jun. 22, 2017, which is the application publication of U.S. Ser. No. 15/129,278 filed on Mar. 25, 2015, the entire contents of which are incorporated herein by reference, including for the compositions and processes set forth therein.

Figure 7:
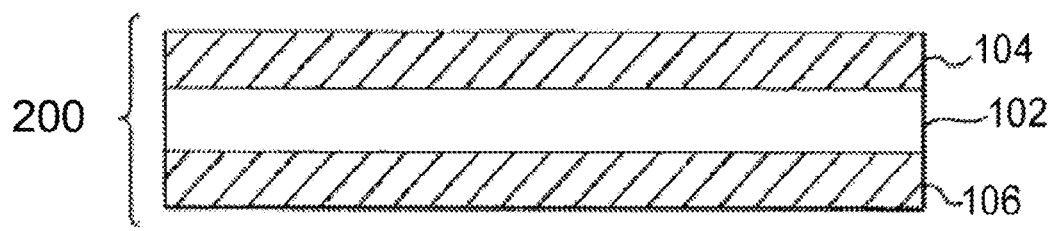
FIG. 7 is a cross-sectional view of a glass article, according to at least one embodiment.

FIG. 7 depicts a glass article according to at least one embodiment. As used herein, the term "average coefficient of thermal expansion" refers to the average coefficient of thermal expansion of a given material or layer between 0° C. and 300° C. As used herein, the term "coefficient of thermal expansion" refers to the average coefficient of thermal expansion unless otherwise indicated.

The strength of at least one glass article described herein is determined using ring-on-ring loading according to the test method described in ASTM C1499-08, Standard Test Method for Monotonic Equibiaxial Flexural Strength of Advanced Ceramics at Ambient Temperature. Generally, the ring-on-ring loading test method is used to determine the biaxial strength of advanced brittle materials at ambient temperature via concentric ring configurations under monotonic uniaxial loading, and has been widely accepted as a method for evaluating the surface strength of glass articles. The ring-on-ring loading results described herein are determined using a 1 in diameter support ring and a 0.5 in diameter loading ring on a 2 in square glass sheet. The contact radius of the ring is 1.6 mm, and the head speed is 1.2 mm/min.

As used herein, the term "retained strength" refers to the strength of a glass article determined after controlled introduction of flaws to an outer surface of the glass article. As used herein, the term "Knoop scratch threshold" refers to the load at which lateral cracking is first observed in a glass article in response to scratching the surface of the glass article with a Knoop diamond at increasing load. The test is performed at room temperature in 50% relative humidity.

As used herein, the term "indentation threshold" refers to the load at which cracks are first observed in a glass article in response to indentation of the surface of the glass article with a Vickers indenter at increasing load. An indentation load is applied to and then removed from a surface of the glass article with the Vickers indenter at a rate of 0.2 mm/min. The maximum indentation load is held for 10 seconds. The indentation threshold is determined as the indentation load at which 50% of 10 indents exhibit any number of radial/median cracks emanating from the corners of the indent impression. The maximum indentation load is increased until the indentation threshold is met for a given glass article. All indentation measurements are performed at room temperature in 50% relative humidity.

As used herein, the term "Vickers scratch threshold" refers to the load at which lateral cracking is first observed in a glass article in response to scratching the surface of the glass article with a Vickers indenter at increasing load. The test procedure is similar to that used to determine Knoop scratch threshold, except that the Vickers indenter is substituted for the Knoop diamond. The lateral cracking is evidenced by sustained cracks in the glass article that are greater than twice the width of the original scratch or groove formed by the Vickers indenter.

In various embodiments, a glass article comprises at least a first layer and a second layer. For example, the first layer comprises a core layer, and the second layer comprises one or more cladding layers adjacent to the core layer. The first layer and/or the second layer are glass layers comprising a glass, a glass-ceramic, or a combination thereof. In some embodiments, the first layer and/or the second layer are transparent glass layers.

FIG. 7 is a cross-sectional view of one exemplary embodiment of a glass article 200. In some embodiments, glass article 200 comprises a laminated sheet comprising a plurality of glass layers. The laminated sheet can be substantially planar as shown in FIG. 7 or non-planar. Glass article 200 comprises a core layer 102 disposed between a first cladding layer 104 and a second cladding layer 106. In some embodiments, first cladding layer 104 and second cladding layer 106 are exterior layers as shown in FIG. 7. In other embodiments, the first cladding layer and/or the second cladding layer are intermediate layers disposed between the core layer and an exterior layer.

Core layer 102 comprises a first major surface and a second major surface opposite the first major surface. In some embodiments, first cladding layer 104 is fused to the first major surface of core layer 102. Additionally, or alternatively, second cladding layer 106 is fused to the second major surface of core layer 102. In such embodiments, the interfaces between first cladding layer 104 and core layer 102 and/or between second cladding layer 106 and core layer 102 are free of any bonding material such as, for example, an adhesive, a coating layer, or any non-glass material added or configured to adhere the respective cladding layers to the core layer. Thus, first cladding layer 104 and/or second cladding layer 106 are fused directly to core layer 102 or are directly adjacent to core layer 102. In some embodiments, the glass article comprises one or more intermediate layers disposed between the core layer and the first cladding layer and/or between the core layer and the second cladding layer. For example, the intermediate layers comprise intermediate glass layers and/or diffusions layers formed at the interface of the core layer and the cladding layer. In some embodiments, glass article 200 is formed as a glass-glass laminate in which the interfaces between directly adjacent glass layers are glass-glass interfaces.

In some embodiments, core layer 102 comprises a first glass composition, and first and/or second cladding layers 104 and 106 comprise a second glass composition that is different than the first glass composition. For example, in the embodiment shown in FIG. 7, core layer 102 comprises the first glass composition, and each of first cladding layer 104 and second cladding layer 106 comprises the second glass composition. In other embodiments, the first cladding layer comprises the second glass composition, and the second cladding layer comprises a third glass composition that is different than the first glass composition and/or the second glass composition.

The glass article can be formed using a suitable process such as, for example, a fusion draw, down draw, slot draw, up draw, or float process. In some embodiments, the glass article is formed using a fusion draw process.

Figure 8:
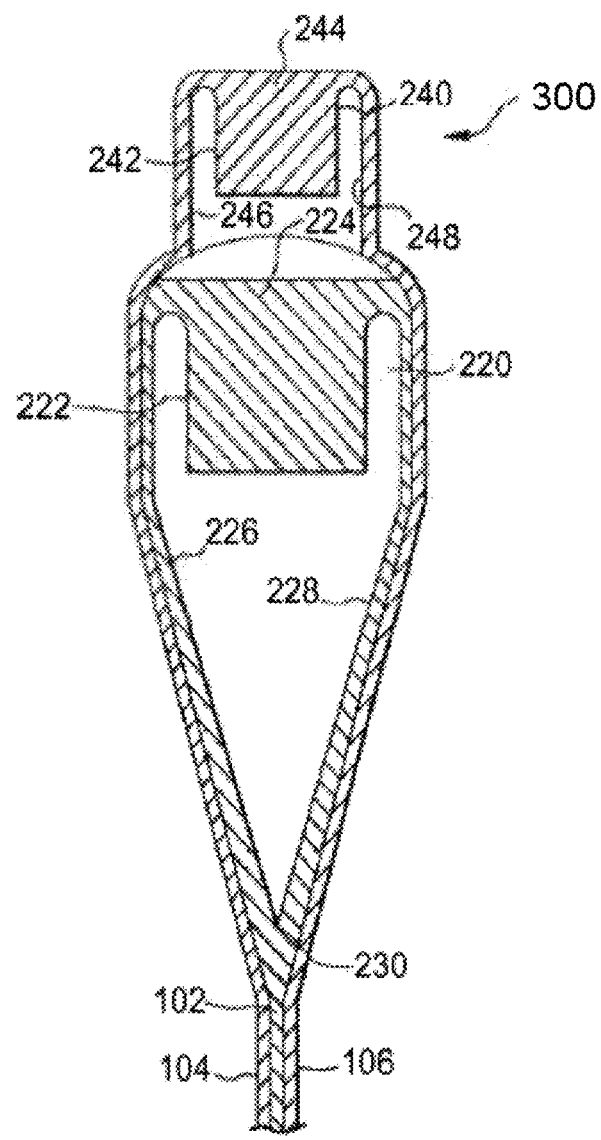
FIG. 8 is a cross-sectional view of an overflow distributor usable to form a glass article, according to at least one embodiment.

FIG. 8 is a cross-sectional view of one exemplary embodiment of an overflow distributor 300 that can be used to form a glass article such as, for example, glass article 200. Overflow distributor 300 can be configured as described in U.S. Pat. No. 4,214,886, which is incorporated herein by reference in its entirety. For example, overflow distributor 300 comprises a lower overflow distributor 220 and an upper overflow distributor 240 positioned above the lower overflow distributor. Lower overflow distributor 220 comprises a trough 222. A first glass composition 224 is melted and fed into trough 222 in a viscous state. First glass composition 224 forms core layer 102 of glass article 200 as further described below. Upper overflow distributor 240 comprises a trough 242. A second glass composition 244 is melted and fed into trough 242 in a viscous state. Second glass composition 244 forms first and second cladding layers 104 and 106 of glass article 100 as further described below.

First glass composition 224 overflows trough 222 and flows down opposing outer forming surfaces 226 and 228 of lower overflow distributor 220. Outer forming surfaces 226 and 228 converge at a draw line 230. The separate streams of first glass composition 224 flowing down respective outer forming surfaces 226 and 228 of lower overflow distributor 220 converge at draw line 230 where they are fused together to form core layer 102 of glass article 100.

Second glass composition 244 overflows trough 242 and flows down opposing outer forming surfaces 246 and 248 of upper overflow distributor 240. Second glass composition 244 is deflected outward by upper overflow distributor 240 such that the second glass composition flows around lower overflow distributor 220 and contacts first glass composition 224 flowing over outer forming surfaces 226 and 228 of the lower overflow distributor. The separate streams of second glass composition 244 are fused to the respective separate streams of first glass composition 224 flowing down respective outer forming surfaces 226 and 228 of lower overflow distributor 220. Upon convergence of the streams of first glass composition 224 at draw line 230, second glass composition 244 forms first and second cladding layers 104 and 106 of glass article 200.

In some embodiments, first glass composition 224 of core layer 102 in the viscous state is contacted with second glass composition 244 of first and second cladding layers 104 and 106 in the viscous state to form the laminated sheet. In some of such embodiments, the laminated sheet is part of a glass ribbon traveling away from draw line 230 of lower overflow distributor 220 as shown in FIG. 8. The glass ribbon can be drawn away from lower overflow distributor 220 by a suitable means including, for example, gravity and/or pulling rollers. The glass ribbon cools as it travels away from lower overflow distributor 220. The glass ribbon is severed to separate the laminated sheet therefrom. Thus, the laminated sheet is cut from the glass ribbon. The glass ribbon can be severed using a suitable technique such as, for example, scoring, bending, thermally shocking, and/or laser cutting. In some embodiments, glass article 200 comprises the laminated sheet as shown in FIG. 7. In other embodiments, the laminated sheet can be processed further (e.g., by cutting or molding) to form glass article 200.

Although glass article 200 shown in FIG. 7 has three layers, other embodiments are included in this disclosure. In other embodiments, a glass article can have a determined number of layers, such as two, four, or more layers. A glass article having a determined number of layers can be formed by modifying the overflow distributor accordingly.

In some embodiments, glass article 200 comprises a thickness of at least about 0.05 mm, at least about 0.1 mm, at least about 0.2 mm, or at least about 0.3 mm. Additionally, or alternatively, glass article 200 comprises a thickness of at most about 2 mm, at most about 1.5 mm, at most about 1 mm, at most about 0.7 mm, or at most about 0.5 mm. In some embodiments, a ratio of a thickness of core layer 102 to a thickness of glass article 200 is at least about 0.8, at least about 0.85, at least about 0.9, or at least about 0.95. In some embodiments, a thickness of the second layer (e.g., each of first cladding layer 104 and second cladding layer 106) is from about 0.01 mm to about 0.3 mm.

In some embodiments, the first glass composition and/or the second glass composition comprise a liquidus viscosity suitable for forming glass article 200 using a fusion draw process as described herein. For example, the first glass composition of the first layer (e.g., core layer 102) comprises a liquidus viscosity of at least about 100 kP, at least about 200 kP, or at least about 300 kP. Additionally, or alternatively, the first glass composition comprises a liquidus viscosity of at most about 3000 kP, at most about 2500 kP, at most about 1000 kP, or at most about 800 kP. Additionally, or alternatively, the second glass composition of the second layer (e.g., first and/or second cladding layers 104 and 106) comprises a liquidus viscosity of at least about 50 kP, at least about 100 kP, or at least about 200 kP. Additionally, or alternatively, the second glass composition comprises a liquidus viscosity of at most about 3000 kP, at most about 2500 kP, at most about 1000 kP, or at most about 800 kP. The first glass composition can aid in carrying the second glass composition over the overflow distributor to form the second layer. Thus, the second glass composition can comprise a liquidus viscosity that is lower than generally considered suitable for forming a single layer sheet using a fusion draw process.

In some embodiments, glass article 200 is configured as a strengthened glass article. For example, in some embodiments, the second glass composition of the second layer (e.g., first and/or second cladding layers 104 and 106) comprises a different average coefficient of thermal expansion (CTE) than the first glass composition of the first layer (e.g., core layer 102). For example, first and second cladding layers 104 and 106 are formed from a glass composition having a lower average CTE than core layer 102. The CTE mismatch (i.e., the difference between the average CTE of first and second cladding layers 104 and 106 and the average CTE of core layer 102) results in formation of compressive stress in the cladding layers and tensile stress in the core layer upon cooling of glass article 200. In various embodiments, each of the first and second cladding layers, independently, can have a higher average CTE, a lower average CTE, or substantially the same average CTE as the core layer.

In some embodiments, the average CTE of the first layer (e.g., core layer 102) and the average CTE of the second layer (e.g., first and/or second cladding layers 104 and 106) differ by at least about $5 \times 10^{-7}$ C.$^{-1}$, at least about $15 \times 10^{-7}$ C.$^{-1}$, or at least about $25 \times 10^{-7}$ C.$^{-1}$. Additionally, or alternatively, the average CTE of the first layer and the average CTE of the second layer differ by at most about $55 \times 10^{-7}$ C.$^{-1}$, at most about $50 \times 10^{-7}$ C.$^{-1}$, at most about $40 \times 10^{-7}$ C.$^{-1}$, at most about $30 \times 10^{-7}$ C.$^{-1}$, at most about $20 \times 10^{-7}$ C.$^{-1}$, or at most about $10 \times 10^{-7}$ C.$^{-1}$. For example, in some embodiments, the average CTE of the first layer and the average CTE of the second layer differ by from about $5 \times 10^{-7}$ C.$^{-1}$ to about $30 \times 10^{-7}$ C.$^{-1}$ or from about $5 \times 10^{-7}$ C.$^{-1}$ to about $20 \times 10^{-7}$ C.$^{-1}$. In some embodiments, the second glass composition of the second layer comprises an average CTE of at most about $40 \times 10^{-7}$ C.$^{-1}$, or at most about $35 \times 10^{-7}$ C.$^{-1}$. Additionally, or alternatively, the second glass composition of the second layer comprises an average CTE of at least about $25 \times 10^{-7}$ C.$^{-1}$, or at least about $30 \times 10^{-7}$ C.$^{-1}$. Additionally, or alternatively, the first glass composition of the first layer comprises an average CTE of at least about $40 \times 10^{-7}$ C.$^{-1}$, at least about $50 \times 10^{-7}$ C.$^{-1}$, or at least about $55 \times 10^{-7}$ C.$^{-1}$. Additionally, or alternatively, the first glass composition of the first layer comprises an average CTE of at most about $90 \times 10^{-7}$ C.$^{-1}$, at most about $85 \times 10^{-7}$ C.$^{-1}$, at most about $80 \times 10^{-7}$ C.$^{-1}$, at most about $70 \times 10^{-7}$ C.$^{-1}$, or at most about $60 \times 10^{-7}$ C.$^{-1}$.

In various embodiments, the glass compositions and the relative thicknesses of the glass layers can be selected to achieve a glass article having desired strength properties. For example, in some embodiments, the first glass composition of the first layer (e.g., core layer 102) and the second glass composition of the second layer (e.g., first and/or second cladding layers 104 and 106) are selected to achieve a desired CTE mismatch, and the thicknesses of each of the first layer and the second layer are selected, in combination with the desired CTE mismatch, to achieve a desired compressive stress in the second layer, a desired tensile stress in the first layer, a desired retained strength, and/or a desired drop threshold.

In various embodiments, the glass compositions and the relative thicknesses of the glass layers can be selected to achieve a glass article having desired surface properties. For example, in some embodiments, the first glass composition of the first layer (e.g., core layer 102), the second glass composition of the second layer (e.g., first and/or second cladding layers 104 and 106), and the thicknesses of each of the first layer and the second layer are selected to achieve a glass article having a desired Knoop scratch threshold and/or a desired indentation threshold.

In some embodiments, the Knoop scratch threshold of the glass article is at least about 5 N, at least about 10 N, or at least about 15 N. Additionally, or alternatively, the indentation threshold of the glass article is at least about 20 N, at least about 30 N, or at least about 40 N. Additionally, or alternatively, the Vickers scratch threshold of the glass article is at least about 2 N, at least about 3 N, at least about 5 N, or at least about 7 N. Additionally, or alternatively, the drop threshold of the glass article is at least about 100 cm, at least about 140 cm, or at least about 160 cm.

In some embodiments, the compressive stress of the cladding layers is at most about 800 MPa, at most about 500 MPa, at most about 300 MPa, at most about 200 MPa, at most about 150 MPa, at most about 100 MPa, at most about 50 MPa, or at most about 40 MPa. Additionally, or alternatively, the compressive stress of the cladding layers is at least about 10 MPa, at least about 20 MPa, at least about 30 MPa, at least about 50 MPa, or at least about 100 MPa.

The first glass composition of the first layer (e.g., core layer 102) and the second glass composition of the second layer (e.g., first cladding layer 104 and/or second cladding layer 106) can comprise suitable glass compositions capable of forming a glass article with desired properties as described herein.

In some embodiments, the first glass composition comprises a glass network former selected from the group consisting of $SiO_2$, $Al_2O_3$, $B_2O_3$, and combinations thereof. For example, the first glass composition comprises at least about 50 mol % $SiO_2$, at least about 55 mol % $SiO_2$, at least about 60 mol % $SiO_2$, or at least about 65 mol % $SiO_2$. Additionally, or alternatively, the first glass composition comprises at most about 80 mol % $SiO_2$, at most about 70 mol % $SiO_2$, at most about 68 mol % $SiO_2$, or at most about 60 mol % $SiO_2$. Additionally, or alternatively, the first glass composition comprises at least about 5 mol % $Al_2O_3$, at least about 9 mol % $Al_2O_3$, or at least about 12 mol % $Al_2O_3$. Additionally, or alternatively, the first glass composition comprises at most about 20 mol % $Al_2O_3$, at most about 17 mol % $Al_2O_3$, or at most about 11 mol % $Al_2O_3$. Additionally, or alternatively, the first glass composition comprises at least about 3 mol % $B_2O_3$, at least about 6 mol % $B_2O_3$, or at least about 7 mol % $B_2O_3$. Additionally, or alternatively, the first glass composition comprises at most about 11 mol % $B_2O_3$, at most about 8 mol % $B_2O_3$, or at most about 4 mol % $B_2O_3$. In some embodiments, the first glass composition is substantially free of $B_2O_3$. For example, the first glass composition comprises at most about 0.1 mol % $B_2O_3$.

In some embodiments, the first glass composition comprises an alkali metal oxide selected from the group consisting of $Li_2O$, $Na_2O$, $K_2O$, and combinations thereof. For example, the first glass composition comprises at least about 0.05 mol % $Na_2O$, at least about 10 mol % $Na_2O$, or at least about 13 mol % $Na_2O$. Additionally, or alternatively, the first glass composition comprises at most about 16 mol % $Na_2O$, at most about 14 mol % $Na_2O$, at most about 2 mol % $Na_2O$, or at most about 0.1 mol % $Na_2O$. Additionally, or alternatively, the first glass composition comprises at least about 0.01 mol % $K_2O$, at least about 2 mol % $K_2O$, or at least about 8 mol % $K_2O$. Additionally, or alternatively, the first glass composition comprises at most about 15 mol % $K_2O$, at most about 9 mol % $K_2O$, at most about 6 mol % $K_2O$, or at most about 0.1 mol % $K_2O$.

In some embodiments, the first glass composition comprises an alkaline earth oxide selected from the group consisting of MgO, CaO, SrO, BaO, and combinations thereof. For example, the first glass composition comprises at least about 1 mol % MgO, at least about 2 mol % MgO, at least about 3 mol % MgO, or at least about 4 mol % MgO. Additionally, or alternatively, the first glass composition comprises at most about 8 mol % MgO, at most about 4 mol % MgO, or at most about 3 mol % MgO. Additionally, or alternatively, the first glass composition comprises at least about 0.01 mol % CaO, at least about 2 mol % CaO, at least about 4 mol % CaO, at least about 5 mol % CaO, or at least about 6 mol % CaO. Additionally, or alternatively, the first glass composition comprises at most about 8 mol % CaO, at most about 7 mol % CaO, at most about 0.1 mol % CaO, or at most about 0.01 mol % CaO. Additionally, or alternatively, the first glass composition comprises at least about 3 mol % SrO, at least about 4 mol % SrO, at least about 5 mol % SrO, or at least about 6 mol % SrO. Additionally, or alternatively, the first glass composition comprises at most about 7 mol % SrO, at most about 6 mol % SrO, or at most about 5 mol % SrO. Additionally, or alternatively, the first glass composition comprises at least about 0.01 mol % BaO, at least about 0.02 mol % BaO, or at least about 0.07 mol % BaO. Additionally, or alternatively, the first glass composition comprises at most about 0.1 mol % BaO, at most about 0.09 mol % BaO, at most about 0.05 mol % BaO, or at most about 0.01 mol % BaO. In some embodiments, the first glass composition is substantially free of SrO. For example, the first glass composition comprises at most about 0.1 mol % SrO.

In some embodiments, the first glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$.

In some embodiments, the second glass composition comprises a glass network former selected from the group consisting of $SiO_2$, $Al_2O_3$, $B_2O_3$, and combinations thereof. For example, the second glass composition comprises at least about 60 mol % $SiO_2$, at least about 62 mol % $SiO_2$, or at least about 67 mol % $SiO_2$. Additionally, or alternatively, the second glass composition comprises at most about 70 mol % $SiO_2$, at most about 68 mol % $SiO_2$, at most about 65 mol % $SiO_2$, or at most about 63 mol % $SiO_2$. Additionally, or alternatively, the second glass composition comprises at least about 6 mol % $Al_2O_3$, at least about 10 mol % $Al_2O_3$, or at least about 12 mol % $Al_2O_3$. Additionally, or alternatively, the second glass composition comprises at most about 18 mol % $Al_2O_3$, at most about 13 mol % $Al_2O_3$, or at most about 8 mol % $Al_2O_3$. Additionally, or alternatively, the second glass composition comprises at least about 4 mol % $B_2O_3$, at least about 6 mol % $B_2O_3$, at least about 9 mol % $B_2O_3$, or at least about 16 mol % $B_2O_3$. Additionally, or alternatively, the second glass composition comprises at most about 21 mol % $B_2O_3$, at most about 18 mol % $B_2O_3$, or at most about 11 mol % $B_2O_3$.

In some embodiments, the second glass composition comprises an alkali metal oxide selected from the group consisting of $Li_2O$, $Na_2O$, $K_2O$, and combinations thereof. For example, the second glass composition comprises from about 0 mol % to about 0.1 mol % $Na_2O$, or from about 0 mol % to about 0.06 mol % $Na_2O$. Additionally, or alternatively, the second glass composition comprises from about 0 mol % to about 0.05 mol % $K_2O$, or from about 0 mol % to about 0.03 mol % $K_2O$. In some embodiments, the second glass composition is substantially free of alkali metal. For example, the second glass composition comprises at most about 0.1 mol % alkali metal oxide. In other embodiments, the second glass composition comprises from about 5 mol % to about 10 mol % alkali metal oxide.

In some embodiments, the second glass composition comprises an alkaline earth oxide selected from the group consisting of MgO, CaO, SrO, BaO, and combinations thereof. For example, the second glass composition comprises at least about 0.2 mol % MgO, at least about 1 mol % MgO, or at least about 3 mol % MgO. Additionally, or alternatively, the second glass composition comprises at most about 5 mol % MgO, at most about 4 mol % MgO, at most about 2 mol % MgO, or at most about 0.5 mol % MgO. Additionally, or alternatively, the second glass composition comprises at least about 3 mol % CaO, at least about 4 mol % CaO, at least about 5 mol % CaO, or at least about 8 mol % CaO. Additionally, or alternatively, the second glass composition comprises at most about 12 mol % CaO, at most about 9 mol % CaO, at most about 8 mol % CaO, or at most about 5 mol % CaO. Additionally, or alternatively, the second glass composition comprises at least about 0.2 mol % SrO, at least about 1 mol % SrO, or at least about 2 mol % SrO. Additionally, or alternatively, the second glass composition comprises at most about 3 mol % SrO, at most about 2 mol % SrO, or at most about 1 mol % SrO. Additionally, or alternatively, the second glass composition comprises at least about 0.01 mol % BaO, at least about 0.02 mol % BaO, or at least about 1 mol % BaO. Additionally, or alternatively, the second glass composition comprises at most about 2 mol % BaO, at most about 0.5 mol % BaO, at most about 0.03 mol % BaO, at most about 0.02 mol % BaO, or at most about 0.01 mol % BaO. In some embodiments, the second glass composition comprises from about 3 mol % to about 16 mol % alkaline earth oxide. Further, in some embodiments, the second glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$. FIG. 1 is a cross-sectional view of a dual carrier in which a wafer is positioned, according to at least one embodiment. As shown in FIG. 1, a wafer (a Si wafer) 101 is positioned in a dual carrier 100. In at least one embodiment, the dual carrier 100 may be constructed from at least one glass article such as the glass article 200 described above. In at least one embodiment, the dual carrier 100 is a carrier support structure or carrier assembly formed of a first carrier 10 and a second carrier 20 positioned below the first carrier 10 so as to support the first carrier 10. The manufacturing of each of the first carrier 10 and second carrier 20 according to at least one exemplary embodiment is described below.

FIGS. 2A-2E depict preparation and formation of the first carrier 10. FIG. 2A is a cross-sectional view of the first carrier 10 of dual carrier 100 prior to patterning, according to at least one embodiment. As shown in FIG. 2A, the first carrier 10 comprises a layer of core material 14 sandwiched between an upper layer 12 of cladding and a lower layer 18 of cladding. In some embodiments, the core material 14 (a core layer) may be glass, and the upper (first) layer 12 and lower (second) layer 18 of cladding may be made of laminates. Thus, the first carrier 10 may be constructed according to at least one embodiment in the manner of the glass article 200, with the core material 14 being made of the same or similar composition(s) as the core layer 102, the upper layer 12 being made of the same or similar composition(s) as the first cladding layer 104, and the lower layer 18 being made of the same or similar composition(s) as the second cladding layer 106, with the respective components being made by the same or similar processes as described above.

In various embodiments, the core material 14 and the upper and lower layers 12, 18 of cladding may be glass with different compositions having different properties. That is, the core material 14 may be different from the cladding of the upper layer 12 and the lower layer 18, and further, in some embodiments, the cladding material of the upper layer 12 may be the same as or different from that of the lower layer 18. More particularly, in some embodiments, one or more of the core material 14, the upper layer 12 or the lower layer 18 may include laminated glass. In some embodiments, a ratio of a thickness of core material 14 to a thickness of the first carrier 10 is at least about 0.8, at least about 0.85, at least about 0.9, or at least about 0.95. FIG. 2B is a cross-sectional view of a first carrier of a dual carrier after patterning, according to at least one embodiment. As shown in FIG. 2B, an etch prevention layer 16 is positioned atop the upper layer 12 of cladding. The etch prevention layer 16 is patterned so as to prepare the first carrier 10 for formation of one or more openings (holes) therein. The patterning of the etch prevention layer 16 creates at least one opening where the upper layer 12 is uncovered, as discussed below. In some embodiments, the etch prevention layer 16 may be photoresist or a mask.

In FIGS. 2A-2C, the depiction of the first carrier 10 is shown as having one opening seen in cross-section. It should be appreciated that this is for ease of illustration and that the dimensions and number of openings in the first carrier 10 may be varied according to certain embodiments. For example, the depictions of the first carrier 10 in FIGS. 2A-2C may depict approximately half of the first carrier 10 (i.e., a section of the carrier 10 with one opening), and the full length of the first carrier 10 may be dimensioned to accommodate two openings in a lengthwise direction of the carrier 10 and two openings in a widthwise direction.

In some embodiments, the first carrier 10 may be dimensioned so as to accommodate 2, 4, 6, 8, 10 or 12 openings, although a different number of openings may be provided in other embodiments. In particular, the number of openings may be varied in consideration of the size of wafer to be held by the first carrier 10. For example, if a silicon wafer of about 12 inches (about 300 mm) in diameter is used, the first carrier 10 may be about 800 mm×800 mm in size and provided with four openings. If a silicon wafer of about 8 inches (about 200 mm) in diameter is used, then the first carrier 10 may be about 550 mm×550 mm and provided with four openings.

FIG. 2D is a top view of the first carrier shown in FIG. 2B, according to at least one embodiment. As seen in FIG. 2D, when patterning is carried out for hole formation, the etch prevention layer 16 is not provided continuously atop the upper layer 12 of cladding. Rather, openings 17 are provided through which the upper layer 12 of cladding is visible when viewed from the top.

FIG. 2C is a cross-sectional view of a first carrier of a dual carrier after etching, according to at least one embodiment. In at least one embodiment, etching in a first etching process is carried out so as to form a hole in the first carrier 10. The etching process removes a portion of the upper layer 12 of cladding, thus enlarging the opening between sides of the adhesive 16. In particular, etching enlarges at least the depth of the opening 17 by removal of the portion of the upper layer 12 that is exposed as a result of patterning.

FIG. 2E is a top view of the first carrier shown in FIG. 2C, according to at least one embodiment. As shown in FIG. 2E, by etching so as to remove a portion of the upper layer 12 of cladding, the core material 14 is exposed directly via the opening 17 and visible when viewed from a top of the first carrier 10.

FIG. 3A is a cross-sectional view depicting a first carrier after patterning to form the opening 17 as a through hole, according to at least one embodiment. As seen in FIG. 3A, patterning may be carried out in such a manner that the etch prevention layer 16 is present not only above the upper layer 12 of cladding, but also at sides of the opening 17, and, in particular, at portions on a periphery of the opening 17 adjacent to the remaining portions of the upper layer 12 and positioned directly above portions of the core material 14 that are not covered by the upper layer 12 of cladding. More particularly, the etch prevention layer 16 is structured such that step portions 13 are present so as to border the opening 17, with the etch prevention layer 16 extending past the step portions 13 in the lateral direction (a direction along the major axis of the first carrier 10).

FIG. 3C is a top view of the first carrier 10 shown in FIG. 3A, according to at least one embodiment. The top view of the first carrier 10 shown in FIG. 3C is comparable to the top view of the first carrier 10 shown in FIG. 2E, although the proportion of surface area covered by the etch prevention layer 16 is altered due to the presence of the etch prevention layer 16 at sides of the opening 17.

FIG. 3B is a cross-sectional view depicting the first carrier 10 after etching and through hole formation, according to at least one embodiment. As shown in FIG. 3B, the upper layer 12 of cladding is removed by a second etching process so as to have a first length in a lateral direction of the first carrier 10 that is shorter than a length of the lower layer 18 of cladding beneath the core material 14. The core material 14 and the lower layer 18 of cladding may have approximately the same length, according to some embodiments.

The configuration of the upper layer 12 of cladding being provided along a shorter extent than the core material 14 and the lower layer 18 of cladding serves to form a stepped or staggered opening 17 having edges or sidewalls 15 at the center of the first carrier 10. The stepped opening 17 is made without mechanical polishing, and is formed instead by the first and second etching processes. That is, a tee-shaped opening is formed in which the stem of the tee has a first width which is the width of the removed portions of the core material 14 and lower layer 18 of cladding that were etched away, and the horizontal portion of the tee perpendicular to the stem has a second width which is the width of the removed portion of the upper layer 12 of cladding that was etched away, which exceeds the first width.

In at least one embodiment, the width of the stepped opening between the sidewall 15 and the edge of the core material 14 may be in the range of about 2 mm to about 5 mm. That is, a distance between the upper layer 12 of cladding of a first segment A and the upper layer 12 of a second segment B of the first carrier 10 exceeds a distance between the lower layer 18 of cladding of the first segment A and the lower layer 18 of the second segment B. During wafer processing, a portion of a wafer adjacent to the sidewalls 15 would generally be excluded as being unusable. In at least one embodiment, the edge exclusion of a wafer which the first carrier 10 is configured to accommodate is about 3 mm.

FIG. 3D is a top view of the first carrier 10 shown in FIG. 3B, according to at least one embodiment. As shown in FIG. 3D, at least because the upper layer 12 of cladding is provided over the entirety of the core material 14, a portion of the core material 14 is visible when the opening 17 is expanded to create a through hole that penetrates through the core material 14 and the lower layer 18 of cladding. The resulting first carrier 10 is thus formed of two distinct pieces according to some embodiments, i.e., the carrier segments A, B separated by the opening 17 as seen in FIG. 3B.

FIGS. 4A-4D depict preparation and formation of the second carrier 20. The second carrier 20 is a carrier piece that supports the first carrier 10 when the first carrier 10 is positioned on the second carrier 20, as shown in FIG. 1.

In some embodiments, the processing and construction of the first carrier 10 and second carrier 20 differ from each other. For example, the first carrier 10 according to some embodiments is manufactured with two distinct etching processes, whereas the second carrier 20 in some embodiments may be made with a single etching process. As a further example, the structural configuration of the first carrier 10 and the second carrier 20 may differ with respect to carrier dimensions and profile. The first carrier 10 is provided with a stepped opening 17, as described above. In contrast, the second carrier 20 is provided as a unitary structure with a projection, as discussed in more detail below.

FIG. 4A is a cross-sectional view of the second carrier 20 of dual carrier 100 after patterning, according to at least one embodiment. The second carrier includes a layer of core material 24 which is sandwiched between an upper layer 22 of cladding material and a lower layer 28 of cladding material. As shown in FIG. 4A, an etch prevention layer 26 is disposed atop a portion of the upper layer 22 of cladding material.

It should be appreciated that this is for ease of illustration and that the dimensions and number of openings in the second carrier 20 may be varied according to certain embodiments. For example, the depictions of the second carrier 20 in FIGS. 4C and 4D may depict approximately half of the second carrier 20 (i.e., a section of the carrier 10 with one opening), and the full length of the second carrier 20 may be dimensioned to accommodate two openings in a lengthwise direction of the second carrier 20 and two openings in a widthwise direction.

FIG. 4C is a top view of the second carrier 20 shown in FIG. 4A, according to at least one embodiment. As shown in FIG. 4C, the etch prevention layer 26 is positioned above the upper layer 22 of cladding material, with the lower layer 28 of cladding material being visible when viewed from the top at portions of the carrier 20 where the etch prevention layer 26 is not provided.

FIG. 4B is a cross-sectional view of the second carrier 20 after etching to form a stage, according to at least one embodiment. More particularly, FIG. 4B depicts the second carrier 20 after wet etching with acid has been carried out. After etching, the portions of the core material 24 and the upper layer 22 of cladding that were not covered by the etch prevention layer 26 are absent. The remaining structure includes the lower layer 28 of cladding which forms a stage or base for the remainder of the second carrier 20.

In particular, the lower layer 28 of cladding is configured as an elongated planar portion. The remaining portion of the core material 24 and the upper layer 22 of cladding that were not removed by the etching form a projection 23. The projection 23 is disposed on the lower layer 28 of cladding, such that the lower layer 28 of cladding provides support for the projection 23 and provides structural stability to the second carrier 20, with the base formed by the lower layer 28 and the projection 23 serving as a stage. The core material 24 and the material for the upper layer 22 and/or lower layer 28 may be different in composition so as to provide for different wet etch rates for selectivity. When the second carrier 20 is assembled with the first carrier 10, the lower layer 28 extends in a lateral direction on either side of the projection 23 so as to support the first and second segments of the first carrier 10 on opposed sides of the projection 23.

FIG. 4D is a top view of the second carrier 20 shown in FIG. 4B, according to at least one embodiment. As shown in FIG. 4D, when etching is performed on the second carrier 20, the etch prevention layer 26 protects a portion of the upper layer 22 of cladding above a portion of the core material 24, whereas the remainder of the upper layer 22 and the core material 24 are removed, leaving only the lower layer 28 positioned below the projection 23. Thus, as seen in the top view, only the upper layer 22 of cladding and lower layer 28 of cladding are visible.

FIG. 5A is a cross-sectional view of the dual carrier 100 to which a wafer 101 is attached, according to at least one embodiment. More particularly, FIG. 5A depicts the dual carrier 100 formed of the first carrier 10 and second carrier 20 assembled together, with the wafer 101 disposed such that a major axis of the body 101 is supported underneath by the projection 23 of the second carrier 20. When the first carrier 10 and second carrier 20 are assembled together, at least part of the upper cladding layer 22 of the second carrier 20 is even with (flush with) at least part of the layer of core material 14 of the first carrier 10, i.e., a level of at least part of the upper cladding layer 22 is a same level as at least part of the layer of core material 14. Further, as shown in FIG. 5A, a majority of the wafer is supported directly by the projection 23. Such a construction helps to secure the wafer 101 in place.

Further, portions of the wafer 101 projecting in a lengthwise direction beyond the projection 23 occupy the space formed by opening 17 of the staggered portion (the stepped opening) of the first carrier 10. That is, in some embodiments, the wafer 101 is positioned so as to occupy a space spanning the distance between the edges 15 of the opening 17. The wafer 101 is attached to the edges 15 of the first carrier 10. For example, in some embodiments, the wafer 101 is attached with adhesive 31 (e.g., thermoplastic adhesive) to the edges 15. More particularly, the adhesive 31 may be provided between the edges 15 of the first carrier 10 and the portion of the core material 24 extending past the upper layer 22 of cladding of the second carrier 22, such that the wafer 101 contacts the adhesive 31 when the wafer 101 is held by the carrier 100. In this manner, the wafer 101 is physically attached to the first carrier 10.

The wafer 101 may be oriented such that a first surface thereof 121 (e.g., a top surface) is a free surface which does not contact against the dual carrier 100. In contrast, a second surface 111 that is an opposed surface (e.g., a bottom surface) is positioned so as to abut against an upper surface of the projection 23, i.e., an upper surface of the upper layer 22 of cladding of the second carrier 20. Neither the first surface 121 nor the second surface 111 have adhesive applied to them in order to attach the wafer 101 to the carrier 101, according to some embodiments. In particular, in at least one embodiment, the entirety of BEOL processing may be carried out with adhesive never applied to the top or bottom surface of the wafer 101. At most, adhesive may be present at sidewalls 15 of the opening 17 in which the wafer is secured in place.

Figure 5B:
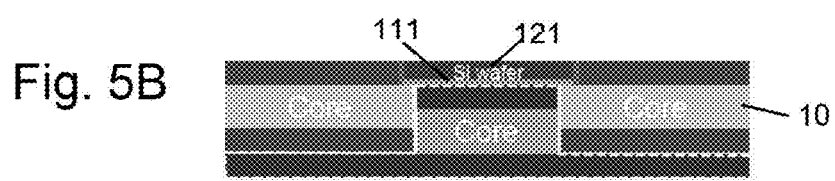
FIG. 5B is a cross-sectional view of a dual carrier after wafer polishing, according to at least one embodiment.

FIG. 5B is a cross-sectional view of the dual carrier 100 after wafer thinning, according to at least one embodiment. As reflected in FIG. 5B, the wafer 101 is thinned so as to reduce a height of the wafer 101. In particular, the wafer 101 may be thinned such that its height is lowered from its original height projecting above the upper layer 12 of cladding of the first carrier 10, to be flush with the upper layer 12 of cladding, in some embodiments.

In some embodiments, the thinning of the wafer 101 may be accomplished with polishing. As shown in FIG. 5B, when the thinning is carried out, the wafer 101 remains in the original orientation in which it was in when attached and connected to the dual carrier 100. That is, the free surface 121 of the wafer 101 is an uppermost surface aligned with the upper layer 12 of cladding, and the bottom surface 111 is positioned so as to abut the projection 23 of the second carrier 20. As described below, the same physical assembly of the wafer 101 in the first carrier 10 may be used both for thinning of the wafer and for dicing the wafer on a dicing stage.

Figure 5C:
FIG. 5C is a cross-sectional view of a dual carrier after a wafer is separated from a second carrier of the dual carrier, according to at least one embodiment.

FIG. 5C is a cross-sectional view of the dual carrier 100 after wafer 101 is separated from the second carrier 20 of the dual carrier 100, according to at least one embodiment. More particularly, FIG. 5C depicts the first carrier 10 and the wafer 101 when detached from the second carrier 20, after thinning of the wafer 101. The first carrier 10 holding the wafer 101 is detached from the second carrier 20 in preparation for dicing. The thinned wafer 101 maintains its position with respect to the first carrier 10, so as to be held between the edges 15 of the upper layer 12 of cladding and supported by the portions of the core material 14 extending beyond the edges 15 of the upper layer 12.

Figure 5D:
FIG. 5D is a cross-sectional view of a portion of a dual carrier after separation of the wafer, according to at least one embodiment.

FIG. 5D is a cross-sectional view of a portion of the dual carrier 100 after detachment of the wafer 101, according to at least one embodiment. More particularly, FIG. 5D depicts the second carrier 20 detached from the first carrier 10 holding the thinned wafer 101. The second carrier 20 is detached from the first carrier such that the projection 23 no longer supports the wafer 101, and the bottom surface 111 of the wafer 101 is no longer abutted against the projection 23. Rather, the bottom surface 111 is free and unobstructed except for those portions which contact against the edges 15 of the upper layer 12 of the first carrier. In at least one embodiment, detachment of the wafer 101 from the dual carrier 100 may be accomplished by virtue of the van der Waals forces of the molecules of the respective components; alternatively or in addition, a thermal release bonding material also may be applied.

Figure 6A:
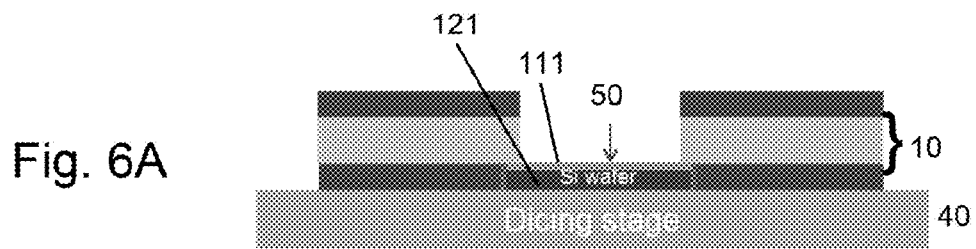
FIG. 6A is a cross-sectional view of a portion of a dual carrier positioned on a stage, according to at least one embodiment.

FIG. 6A is a cross-sectional view of a portion of the dual carrier 100 positioned on a stage, according to at least one embodiment. In particular, FIG. 6A shows the first carrier 10 in an inverted orientation as compared to FIG. 5C, for example. In at least one embodiment, after the wafer 101 has been thinned and after the second carrier 20 has been detached from the first carrier, the assembly of the first carrier 10 holding the wafer 101 is flipped over. That is, the wafer 101 is inverted without removing the wafer 101 from the first carrier 10. A semiconductor device 50 (e.g., an integrated circuit) made of wafer 101 is held in the carrier 100.

When inverted, as shown in FIG. 6A, the surface 111 of the wafer 101 is no longer the bottom surface of the wafer 101; rather, it is a top surface and a majority of the surface 111 is exposed and unobstructed. Further, when inverted, the surface 121 of the wafer 101 is no longer an upper, free surface and is instead a bottom surface of wafer 101. In the inverted state, the assembly of the first carrier 10 and wafer 101 is positioned atop a dicing stage 40 in preparation for dicing of the wafer 101. A dicing tool is positioned above the wafer 101 when the wafer 101 is disposed on the dicing stage 40.

In this manner, transport of the wafer 101 to the dicing stage 40 is accomplished without removing the wafer 101 from the first carrier 10, thereby avoiding the need for a separate debonding process to detach the wafer from its support. In particular, a laser debonding process may be omitted entirely. By omitting the debonding process, the risk of damage to the fragile thinned wafer 101 is reduced. In this manner, the wafer yield may be improved, i.e., fewer wafers may be damaged.

Figure 6B:
FIG. 6B is a cross-sectional view of a portion of a dual carrier positioned on a stage during dicing of a wafer, according to at least one embodiment.

FIG. 6B is a cross-sectional view of a portion of a dual carrier positioned on a stage during dicing of a wafer, according to at least one embodiment. A dicing tool is utilized so as to slice the wafer 101 into a plurality of dies, e.g., such that the wafer 101 is sliced at demarcation points 60. The dicing tool is employed to carry out dicing when the wafer 101 is still in the carrier 10; in other words, the wafer 101 does not need to be transported to another location, and dicing may be carried out in situ. Put another way, the thinned wafer 101 is not transported from the location where it was thinned to the location where it is then sliced.

Figure 6C:
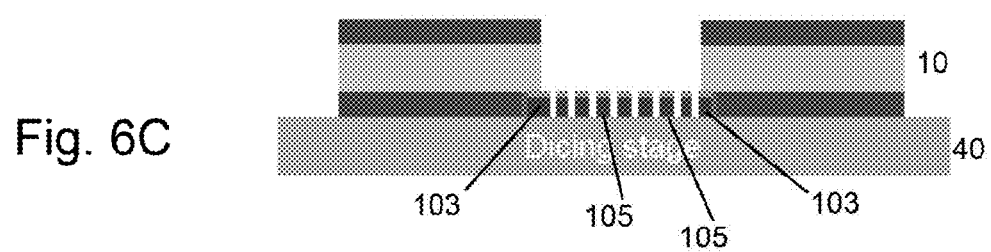
FIG. 6C is a cross-sectional view of a portion of a dual carrier positioned on a stage with a wafer in a diced state, according to at least one embodiment.

FIG. 6C is a cross-sectional view of a portion of the dual carrier 100 positioned on the stage 40 with the wafer 101 in a diced state, according to at least one embodiment. More particularly, following dicing with the dicing tool, the wafer 101 is divided into a plurality of individual dies, including two outermost dies 103 (silicon edges) and interior dies 105. For various manufacturing reasons related to BEOL processing phenomena, the outermost dies 103 are generally inferior to the interior dies 105 and are typically discarded (i.e., these portions are the excluded edges). The remaining dies 105 are then kept for further processing. No debonding is needed because the dies 105 are already sliced and removable from the carrier 10.

Following detachment of the first carrier 10 from the second carrier 20, the second carrier 20 may be recycled according to some embodiments. In some embodiments, both the first carrier 10 and second carrier 20 may be recycled at the same time, after slicing of the wafer 101 is completed. As shown in FIG. 6C, the outermost dies 103 are adjacent to the location of adhesive 31 on the edges 15 of the upper layer 12 of cladding of the first carrier. The outermost dies 103 and the adhesive 31 may be extracted when the first carrier 10 is recycled. The adhesive 31 may be removed by applying heat and/or chemical compositions to the adhesive.

Figure 9:
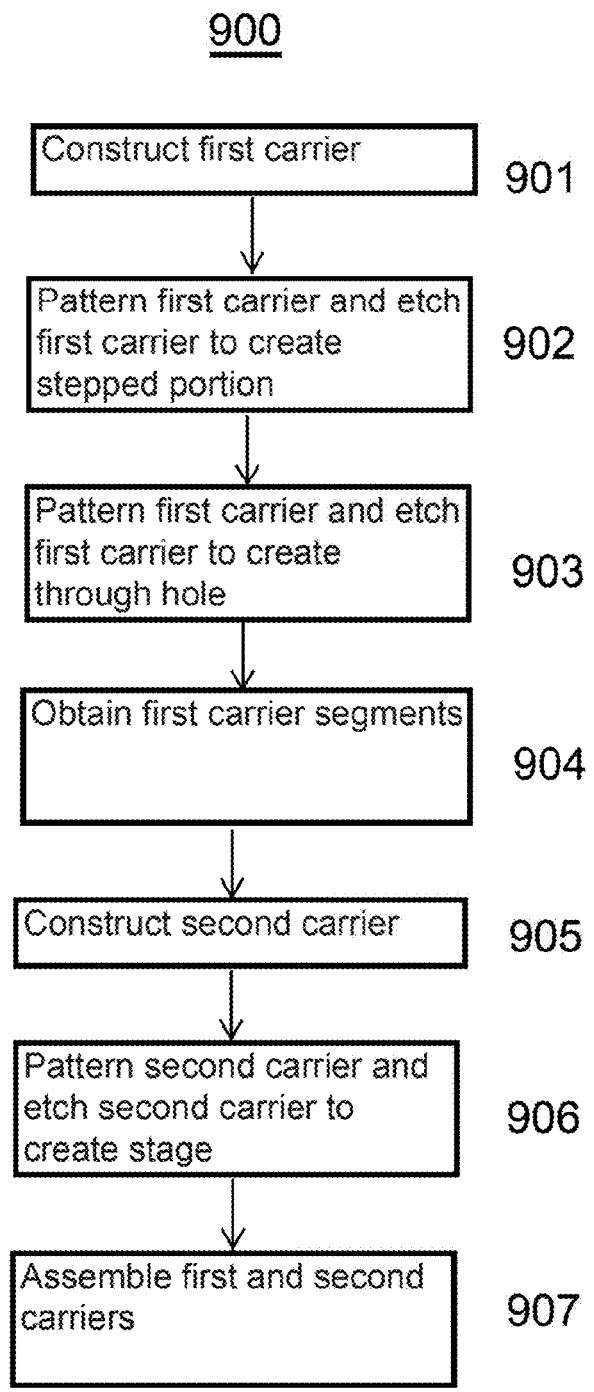
FIG. 9 depicts a process of making a dual carrier according to at least one embodiment.

It should be appreciated that the foregoing embodiments are merely illustrative. Other dual carrier geometries may be employed. Furthermore, the carrier 100 is not limited to a two-piece carrier, and may be formed of fewer or additional components. In addition, further processing may be carried out using the first carrier 10 and/or second carrier 20 or other components described above, in some embodiments. For example, the dicing stage 40 may be used for processes including back grinding of the wafer 101 and other BEOL processing, in addition to slicing of the wafer 101. FIG. 9 depicts an exemplary process diagram of a process 900 for making a dual carrier according to at least one embodiment. The process includes constructing the first carrier 10 according to the techniques described above (901). More particularly, the first carrier 10 is made of the core layer 14, the upper layer 12 and lower layer 18 of cladding, and these components may be formed and assembled as described above in connection with FIGS. 7 and 8. Namely, the core layer 14, the upper layer 12 and the lower layer 18 may be made using a distributor as shown in FIG. 8. The upper layer 12 and lower layer 18 of cladding may be attached to the core layer 14, e.g., by fusing. The core layer 14 is thus sandwiched between the upper layer 12 and the lower layer 18. The second carrier 20 is made in a similar manner.

In at least one embodiment, after the first carrier 10 is made, the first carrier 10 is subjected to a first process of patterning and etching (902). More particularly, an etch prevention layer 16 is provided on the upper layer 12 of cladding for patterning, i.e., determining which portions will be removed by etching or retained. Then, etching is performed (e.g., wet etching) to remove a portion of the upper cladding layer 12, thereby exposing part of the core layer 14. In this manner, the stepped portion of the carrier 10 where the sidewalls 15 are present is formed. Next, a second process of patterning and etching is carried out (903). In the second process, the etch prevention layer 16 is provided so as to extend past the sidewalls 15 along a major surface of the upper layer 12 of cladding. Etching (e.g., wet etching) is performed to create an opening 17 that divides the first carrier 10 into the first segment A and second segment B as shown in FIG. 3B so as to obtain a segmented carrier (904).

The process 900 further involves constructing the second carrier 20 (905). The core layer 24, upper layer 22 and lower layer 28 of cladding are formed, and the core layer 24 is attached to the upper layer 22 and the lower layer 28 according to the techniques shown and described above in connection with FIGS. 7-8. Then, the second carrier 20 is subjected to patterning and etching (906). Etch prevention layer 26 is positioned over the upper layer 22 of cladding. Etching (e.g., wet etching) is performed such that the resulting carrier 20 includes a base of the lower layer 28 of cladding and a projection 23 extending from the base and including the core layer 24 and upper layer 22, serving as a stage. The first carrier 10 and second carrier 20 are then assembled together (907).

In particular, segment A of first carrier 10 is positioned on a first side of the base of the second carrier 20, i.e., at a first base portion, and segment B of the first carrier 10 is positioned at a second side of the base, i.e., at a second base portion, that is opposed to the first side, with the projection 23 between the segments A, B. As mentioned above, when the second carrier 20 is assembled with the first carrier 10, the level of the upper cladding layer 22 of the second carrier 20 is even with the level of the layer of core material 14 of the first carrier 10. It should be appreciated that the first carrier 10 and second carrier 20 may be constructed at the same time or with one of the first carrier 10 being made before the second carrier 20, or vice versa.

The term "connected" or "coupled" and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the figures. It should be noted that the orientation of various elements may differ according to other exemplary embodiments, and that such variations are intended to be encompassed by the present disclosure.

It is important to note that the construction and arrangement of the various example embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, various parameters, mounting arrangements, use of materials, orientations, etc.) without materially departing from the novel teachings and advantages of the subject matter described herein.

For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various example embodiments without departing from the scope of the concepts presented herein.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation.

Conversely, various features described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. A carrier assembly, comprising:
    a first carrier comprising an opening configured to accommodate a wafer, the first carrier being divided into a first segment and a second segment opposed to the first segment; and
    a second carrier comprising
        a projection structured to support the wafer; and
        a base disposed beneath the projection, the base configured to extend in a lateral direction on either side of the projection so as to support the first and second segments of the first carrier on opposed sides of the projection,
    wherein the first carrier and the second carrier are configured from laminated glass comprising a plurality of glass layers.

2. The carrier assembly of claim 1, wherein the second carrier is disposed so as to support the wafer without adhesive between a bottom of the wafer and the second carrier.

3. The carrier assembly of claim 1, wherein the glass layers of the first segment of the first carrier comprise:
    a first cladding layer;
    a second cladding layer; and
    a core layer between the first cladding layer and the second cladding layer,
    wherein the first cladding layer is dimensioned so as to be shorter in length than each of the second cladding layer and the core layer.

4. The carrier assembly of claim 3, wherein the core layer has a coefficient of thermal expansion which is greater than a coefficient of thermal expansion of the first cladding layer or the second cladding layer.

5. The carrier assembly of claim 1, wherein the glass layers comprise a first cladding layer, a second cladding layer, and a core layer disposed between the first and second cladding layers, and wherein the opening is structured such that a distance between the first cladding layer of the first segment and the first cladding layer of the second segment exceeds a distance between the second cladding layer of the first segment and the second cladding layer of the second segment.

6. The carrier assembly of claim 1, wherein the glass layers of each of the first and the second segments of the first carrier comprise:
  a first cladding layer;
  a second cladding layer; and
  a core layer between the first cladding layer and the second cladding layer,
    wherein the first cladding layer is dimensioned so as to be shorter in length than each of the second cladding layer and the core layer.

7. The carrier assembly of claim 1, wherein the first carrier is structured to support the wafer when the second carrier is detached from the first carrier.

8. The carrier assembly of claim 1, wherein the opening is formed as a tee.

9. The carrier assembly of claim 1, wherein the first carrier is structured to maintain a position of the wafer when the first carrier is inverted, with the wafer being accommodated in the opening.

10. The carrier assembly of claim 1, further comprising a plurality of openings.

11. The carrier assembly of claim 3, wherein a ratio of a thickness of the core layer to a thickness of the first carrier is at least about 0.8.

12. A method of processing a wafer, comprising:
  supporting the wafer in a first carrier, the first carrier being supported in turn by a second carrier, the first and second carriers formed from laminated glass comprising a plurality of glass layers;
  thinning the wafer while the wafer is positioned in the first carrier;
  detaching the first carrier from the second carrier;
  inverting the first carrier; and
  disposing the first carrier above a dicing stage.

13. The method of claim 12, further comprising dicing the wafer while the wafer is inverted above the dicing stage and held in the first carrier so as to yield a plurality of dies.

14. The method of claim 13, further comprising removing dies while the dies are positioned above the dicing stage in the first carrier.

15. The method of claim 12, further comprising transporting the wafer to the dicing stage while the wafer is supported by the first carrier.

16. A method of manufacturing a carrier assembly, comprising:
  constructing a first carrier of the carrier assembly by
    attaching a first cladding layer of the first carrier to a first core layer; and
    attaching a second cladding layer of the first carrier to the first core layer, such that the first core layer is sandwiched between the first cladding layer and the second cladding layer of the first carrier, each of the first cladding layer, the second cladding layer, and core layer of the first carrier comprising glass;
  performing a first etching process on the first carrier to expose a portion of the first core layer; and
  performing a second etching process on the first carrier to form a through hole, wherein formation of the through hole divides the first carrier into a first segment and a second segment.

17. The method of claim 16, further comprising:
constructing a second carrier by
  attaching a first cladding layer of the second carrier to a second core layer; and
  attaching a second cladding layer of the second carrier to the first core layer, such that the first core layer is sandwiched between the first cladding layer and the second cladding layer of the second carrier, each of the first cladding layer, the second cladding layer, and core layer of the second carrier comprising glass; and
performing a first etching process on the second carrier to create a projection and a base.

18. The method of claim 17, further comprising assembling the first carrier and the second carrier by placing the first segment above a first portion of the base of the second carrier at a first side of the projection, and placing the second segment above a second portion of the base of the second carrier at a second side of the projection opposed to the first side.

19. The method of claim 16, wherein the first etching process comprises placing an etch prevention layer above a portion of the first cladding layer of the first carrier, and the second etching process comprises placing the etch prevention layer so as to extend past edges of the first cladding layer.

20. The method of claim 17, wherein the first and second cladding layer of the first carrier are attached to the first core layer by a fusing process.

* * * * *